(12) United States Patent
Zhang et al.

(10) Patent No.: US 11,712,762 B2
(45) Date of Patent: *Aug. 1, 2023

(54) LOW TEMPERATURE MELTING AND MID TEMPERATURE MELTING LEAD-FREE SOLDER PASTE WITH MIXED SOLDER ALLOY POWDERS

(71) Applicant: INDIUM CORPORATION, Utica, NY (US)

(72) Inventors: Hongwen Zhang, Utica, NY (US); Fen Chen, Suzhou (CN); Francis Mutuku, Utica, NY (US); Jie Geng, Utica, NY (US); Ning-Cheng Lee, Utica, NY (US)

(73) Assignee: INDIUM CORPORATION, Utica, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/688,735

(22) Filed: Mar. 7, 2022

(65) Prior Publication Data

US 2022/0184749 A1 Jun. 16, 2022

Related U.S. Application Data

(63) Continuation of application No. 16/518,180, filed on Jul. 22, 2019, now Pat. No. 11,267,080.

(30) Foreign Application Priority Data

May 9, 2019 (CN) .......................... 201910383054.3

(51) Int. Cl.
*B23K 1/00* (2006.01)
*B23K 35/00* (2006.01)
(Continued)

(52) U.S. Cl.
CPC ............ *B23K 35/262* (2013.01); *B23K 1/008* (2013.01); *B23K 35/025* (2013.01); *C22C 13/02* (2013.01)

(58) Field of Classification Search
CPC .... B23K 35/262; B23K 1/008; B23K 35/025; B23K 2101/36; B23K 1/0016;
(Continued)

(56) References Cited

U.S. PATENT DOCUMENTS 4,487,638 A 12/1984 Hoge
5,229,070 A 7/1993 Melton et al.
(Continued)

FOREIGN PATENT DOCUMENTS

CN 1887500 1/2007
CN 1925946 3/2007
(Continued)

OTHER PUBLICATIONS

International Search Report and Written Opinion dated Jul. 7, 2020 for International Application No. PCT/US2020/032116, filed May 8, 2020.
(Continued)

*Primary Examiner* — Kiley S Stoner
(74) *Attorney, Agent, or Firm* — Sheppard, Mullin, Richter & Hampton LLP (57) ABSTRACT

Implementations of the disclosure are directed to a lead-free mixed solder powder paste suitable for low temperature to middle temperature soldering applications. The lead-free solder paste may consist of: an amount of a first solder alloy powder between 44 wt % and 83 wt %, the first solder alloy powder comprising Sn; an amount of a second solder alloy powder between 5 wt % to 44 wt %, the second alloy powder comprising Sn, where the first solder alloy powder has a liquidus temperature lower than a solidus temperature of the
(Continued)

second solder alloy powder; and a remainder of flux. The solder paste may be used for reflow at a peak temperature below the solidus temperature of the higher solidus temperature solder powder but above the melting temperature of the lower solidus temperature one.

21 Claims, 5 Drawing Sheets

(51) Int. Cl.
  *B23K 35/26* (2006.01)
  *C22C 13/02* (2006.01)
  *B23K 35/02* (2006.01)
  *B23K 1/008* (2006.01)

(58) Field of Classification Search
  CPC ........ B23K 1/203; B23K 35/264; B23K 1/00; C22C 13/02; H05K 3/3463; H05K 2201/0272; H05K 3/3485
  See application file for complete search history.

(56) References Cited

U.S. PATENT DOCUMENTS

| | | |
|---|---|---|
| 5,454,363 A | 10/1995 | Sata |
| 5,569,433 A | 10/1996 | Chen et al. |
| 6,214,131 B1 | 4/2001 | Hua |
| 6,596,094 B2 | 7/2003 | Ochiai et al. |
| 6,613,123 B2 | 9/2003 | Corbin et al. |
| 6,896,172 B2 | 5/2005 | Taguchi et al. |
| 6,936,115 B2 | 8/2005 | Mallon et al. |
| 7,604,154 B2 | 10/2009 | Matsumoto et al. |
| 8,961,709 B1 | 2/2015 | Takaura et al. |
| 10,010,979 B2 | 7/2018 | Sawamura et al. |
| 2002/0012607 A1 | 1/2002 | Corbin et al. |
| 2002/0040624 A1 | 4/2002 | Nakamura et al. |
| 2002/0051728 A1 | 5/2002 | Sato et al. |
| 2002/0121863 A1 | 9/2002 | Morishita |
| 2009/0315178 A1 | 12/2009 | Sakurai et al. |
| 2012/0018048 A1* | 1/2012 | Yamashita ............. H05K 3/341 148/24 |
| 2012/0286218 A1 | 11/2012 | Mei et al. |
| 2014/0117070 A1 | 5/2014 | Choi et al. |
| 2018/0229333 A1* | 8/2018 | Hino ....................... C08L 63/10 |
| 2018/0277506 A1 | 9/2018 | Watanabe et al. |
| 2019/0156967 A1 | 5/2019 | Prestayko et al. |

FOREIGN PATENT DOCUMENTS

| | | | |
|---|---|---|---|
| CN | 1927525 | A | 3/2007 |
| CN | 101269444 | | 9/2008 |
| CN | 101269445 | | 9/2008 |
| CN | 101269445 | A * | 9/2008 |
| CN | 102892549 | | 1/2013 |
| CN | 104043911 | | 9/2014 |
| CN | 107530834 | | 1/2018 |
| CN | 108857135 | | 11/2018 |
| EP | 1180411 | | 2/2002 |
| EP | 1724050 | | 11/2006 |
| JP | H08206874 | A | 8/1996 |
| JP | 2634553 | B2 | 7/1997 |
| JP | H09 277082 | | 10/1997 |
| JP | H11138292 | A | 5/1999 |
| JP | H11320177 | A | 11/1999 |
| JP | H11 347784 | | 12/1999 |
| JP | 2000190090 | A | 7/2000 |
| JP | 2000511466 | | 9/2000 |
| JP | 2001150179 | | 6/2001 |
| JP | 2002-001573 | | 1/2002 |
| JP | 4008799 | B2 | 11/2007 |
| JP | 2011240352 | A | 12/2011 |
| JP | 4961165 | B2 | 6/2012 |
| JP | 5166261 | B2 | 3/2013 |
| JP | 2014527466 | A | 10/2014 |
| JP | 2015205293 | A * | 11/2015 |
| KR | 101630935 | B1 | 6/2016 |
| WO | WO 1997/043081 | | 11/1997 |
| WO | WO 2005/099961 | | 10/2005 |
| WO | WO 2008/056676 | | 5/2008 |

OTHER PUBLICATIONS

Chinese First Office Action dated Jul. 2, 2021 for Chinese Application No. 2019109814544.
Chinese Second Office Action dated Mar. 23, 2022 for Chinese Application No. 2019109814544.
Notification of Third Office Action dated Oct. 24, 2022 for Chinese Application No. 201910981454.4.
Notification of Decision of Rejection dated Dec. 28, 2022 for Chinese Application No. 201910981454.4.

* cited by examiner

LOW TEMPERATURE MELTING AND MID TEMPERATURE MELTING LEAD-FREE SOLDER PASTE WITH MIXED SOLDER ALLOY POWDERS

CROSS-REFERENCE TO RELATED APPLICATIONS

This application is a continuation of U.S. patent application Ser. No. 16/518,180 filed Jul. 22, 2019, issued as U.S. Pat. No. 11,267,080 on Mar. 8, 2022, and titled "Low temperature melting and mid temperature melting lead-free solder paste with mixed solder alloy powders," which claims priority to Chinese Patent Application No. 2019103830543 filed on May 9, 2019, and titled "Mid-melting and low-melting lead-free solder paste produced by mixing solder powders."

DESCRIPTION OF THE RELATED ART

The electronics industry is moving toward miniaturized components with an increasing number of integrated system-in-package (SIP) designs. In some SIP designs, step soldering involving multiple reflows may be desired to interconnect the components together into one assembly. To reduce the risk of solder remelting during a subsequent reflow (e.g., after the first reflow), solders of different melting temperature may be required. SnAgCu solders having a melting temperature around 217° C. are commonly used for a first stage soldering interconnection. For a second stage soldering interconnection, the melting temperature of the solder may need to be significantly lower than that of the SnAgCu solder. Commonly, at least a 30° C. difference is expected to permit the second stage reflow to proceed without causing the remelting of the previous interconnection solder joint formed with the SnAgCu solder. For a third stage soldering interconnection, the melting temperature of the solder should be even lower than the melting temperature of the second level solder.

Current low temperature solders recognized by the industry include eutectic Sn—In having a solidus temperature of about 118° C., and eutectic Bi—Sn and modified relatives having a solidus temperature of around 139° C. Eutectic Sn—In and modified Sn—In alloys are much softer than traditional SnAgCu alloys. Eutectic Bi—Sn and near-eutectic Bi—Sn modified alloys are brittle in nature because of the existence of a high Bi content. In addition, the melting temperature of these two alloys may be too low to allow both alloy systems to survive the board-level reliability requirement of 125° C.

Transient liquid phase bonding (TLPB) technology is aimed at achieving a higher remelting temperature of a solder joint through the formation of intermetallic compounds (IMCs) between low melting temperature alloys and high melting temperatures alloys. In a TLPB design, the low melting phase is mostly or even completely consumed during reflow to reach the high melting temperature target. The interfacial IMC formation on the surface of the high melting alloys and the continuous IMC growth come at the expense of both low melting alloys and high melting alloys during the reflow.

BRIEF SUMMARY OF EMBODIMENTS

Implementations of the disclosure are directed to a lead-free mixed solder powder paste suitable for low temperature to middle temperature soldering applications. The solder paste may include at least two solder powder alloys having significantly different solidus temperatures. The solder paste may be designed for reflow at a peak temperature below the solidus temperature of solder powder having the higher solidus temperature but above the melting temperature of the lower one.

The lead-free mixed solder powder paste described herein may address the need for reliable low melting temperature and middle melting temperature solders, including ones that are strong and ductile. For example, lower melting temperature solders of eutectic Sn—In and modifications thereof, Bi—Sn and modifications thereof, Sn—In—Ag, and Bi—Sn—Ag may be mixed with Sn-rich (e.g., SnAg, SnCu, SnAgCu, SnSb, etc.) solder alloys and modifications thereof to form the solder paste. During reflow, the lower melting temperature solder alloy melts first, and may spread onto the surface to wet and react with surface metallization to form interface IMCs. The higher melting temperature solder alloy (e.g., SnAg, SnCu, SnAgCu, SnSb, SnAgSb, SnAgCuSb, SnAgCuBi, SnAgCuBiSb, etc.) may continuously dissolve into the molten solder since both the lower melting temperature and higher melting temperature solder alloys are composed of significant amounts of Sn.

The continuous dissolution of Sn from an Sn-rich solder into a molten solder may change the composition significantly. As a result, the liquidus temperature may increase with increasing Sn content for both Sn—In and Bi—Sn solder systems. With enough Sn dissolution during reflow, the composition may move into the Sn-rich solid solution zone from the eutectic zone. Afterwards, the remelting temperature of the joint matrix may bear with the solidus temperature of the solid solution, which increases with increasing Sn-content.

The remaining higher melting temperature solder powder may be trapped in the solid solution matrix if it is not completely dissolved during reflow. The trapped remaining higher melting temperature solder powder may remain as colonies embedded in the matrix. The existence of these colonies may enhance the mechanical performance of the matrix. Depending on the alloys being selected, the reflow joint may exhibit the combination of merits from both constituent powders.

In contrast to TLPB technology, implementations described herein do not need to rely on IMC formation to increase the melting temperature at all. It is not expected that interfacial IMC phases will form on the surface of the higher melting temperature solder alloys. Rather, the solder paste may be reflowed at a relatively lower peak temperature, while the higher melting temperature solder alloy powders are continuously dissolved into the molten lower melting temperature solder alloy to form a homogeneous liquid solution. The dissolution of the higher melting temperature solder powder into the molten lower melting temperature one may continue during the whole reflow process. In design, the ratio of the constituent powders and the powder sizes may be controlled to allow the existence of the remaining high melting phase colonies after reflow and solidification, which would improve mechanical performance improvement.

In one embodiment, a lead-free solder paste consists of: an amount of a first solder alloy powder between 44 wt % and 83 wt %, the first solder alloy powder comprising Sn; an amount of a second solder alloy powder between 5 wt % to 44 wt %, the second alloy powder comprising Sn, wherein the first solder alloy powder has a liquidus temperature lower than a solidus temperature of the second solder alloy powder; and a remainder of flux.

In some implementations, the first solder alloy powder is In—Sn, Bi—Sn, an In—Sn alloy, or a Bi—Sn alloy.

In some implementations, the first solder alloy powder is In—Sn—Ag, In—Sn—Cu, or In—Sn—Ag—Cu. In particular implementations, the first solder alloy powder is one of the following: 10 wt % to 52 wt % In, 0.1 wt % to 3.8 wt % Ag, and a remainder of Sn; 10 wt % to 52 wt % In, 0.1 wt % to 1.2 wt % Cu, and a remainder of Sn; and 10 wt % to 52 wt % In, 0.01 to 3.8 wt % Ag, 0.1 to 1.2 wt % Cu, and a remainder of Sn.

In some implementations, the first solder alloy powder is Bi—Sn—Ag, Bi—Sn—Cu, or Bi—Sn—Ag—Cu. In particular implementations, the first solder alloy powder is one of the following: 40 wt % to 65 wt % Bi, 0.1 wt % to 2 wt % Ag, with a remainder of Sn; 40 wt % to 65 wt % Bi, 0.1 wt % to 1.2 wt % Cu, with a remainder of Sn; and 40 wt % to 65 wt % Bi, 0.1 wt % to 2 wt % Ag, 0.1 wt % to 1.2 wt % Cu, with a remainder of Sn.

In particular implementations, the first solder alloy powder is 52In48Sn or 58Bi42Sn.

In some implementations, the first solder alloy powder comprises one or more of the following dopants in an amount from 0.001 wt % to 3 wt % of the first solder alloy powder: Sb, Bi, Ni, Co, Mn, P, and Zn.

In some implementations, the second solder alloy powder is Sn—Ag, Sn—Cu, Sn—Ag—Cu, Sn—Sb, an Sn—Ag alloy, an Sn—Cu alloy, an Sn—Ag—Cu alloy, or an Sn—Sb alloy.

In some implementations, the second solder alloy powder is Sn—Ag, Sn—Cu, Sn—Ag—Cu, an Sn—Ag alloy, an Sn—Cu alloy, or an Sn—Ag—Cu alloy. In particular implementations, the second solder alloy powder is one of the following: Sn—Ag—X (X=Sb, Bi, In, Ni, Co, Mn, P and Zn) consisting of 0.1 wt % to 3.8 wt % Ag, 0.001 wt % to 10 wt % of X, and a remainder of Sn; Sn—Cu—X (X=Sb, Bi, In, Ni, Co, Mn, P and Zn) consisting of 0.1 wt % to 1.2 wt % Cu, 0.001 wt % to 10 wt % of X, and a remainder of Sn; and Sn—Ag—Cu—X (X=Sb, Bi, In, Ni, Co, Mn, P and Zn) consisting of 0.1 wt % to 3.8 wt % of Ag, 0.1 wt % to 1.2 wt % Cu, 0.001 wt % to 10 wt % of X, and a remainder of Sn.

In particular implementations, the second solder alloy powder is 96.5Sn3.5Ag, 99.3Sn0.7Cu, 95.5Sn3.8Ag0.7Cu, or 96.5Sn3.0Ag0.5Cu.

In some implementations, the second solder alloy powder is Sn—Sb or Sn—Sb—Y (Y=Ag, Cu, Bi, In, Ni, Co, Mn, P and Zn).

In particular implementations, the second solder alloy powder consists of 0.5 wt % to 10 wt % Sb, and a remainder of Sn.

In particular implementations, the second solder alloy powder is Sn—Sb—Y (Y=Ag, Cu, Bi, In, Ni, Co, Mn, P and Zn) consisting of 0.5 wt % to 10 wt % Sb, 0.001 wt % to 5 wt % of Y, and a remainder of Sn.

In one embodiment, a method includes: placing a lead-free solder paste between components to form an assembly, the solder paste consisting of: an amount of a first solder alloy powder between 44 wt % and 83 wt %, the first solder alloy powder comprising Sn; an amount of a second solder alloy powder between 5 wt % to 44 wt %, the second solder alloy powder comprising Sn, wherein the first solder alloy powder has a liquidus temperature lower than a solidus temperature of the second solder alloy powder; and a remainder of flux; and reflow soldering the assembly to form a solder joint, wherein the formed solder joint has a liquidus temperature higher than a peak reflow soldering temperature used during reflow soldering.

In some implementations of the method, during reflow soldering, the second solder alloy powder partially dissolves into a molten form of the first solder alloy powder. In some implementations of the method, during reflow soldering, the second solder alloy powder does not form an intermetallic compound with the molten form of the first solder alloy powder.

In some implementations of the method, the formed solder joint has a solidus temperature higher than a solidus temperature of the first solder ally powder.

In some implementations of the method, the first solder alloy powder is In—Sn, Bi—Sn, an In—Sn alloy, or a Bi—Sn alloy; and the second solder alloy powder is Sn—Ag, Sn—Cu, Sn—Ag—Cu, Sn—Sb, an Sn—Ag alloy, an Sn—Cu alloy, an Sn—Ag—Cu alloy, or an Sn—Sb alloy.

In one embodiment, a solder joint is formed by a process, the process comprising: placing a lead-free solder paste between components to form an assembly, the solder paste consisting of: an amount of a first solder alloy powder between 44 wt % and 83 wt %, the first solder alloy powder comprising Sn; an amount of a second solder alloy powder between 5 wt % to 44 wt %, wherein the first solder alloy powder has a liquidus temperature lower than a solidus temperature of the second solder alloy powder, the second solder alloy powder comprising Sn; and a remainder of flux; and reflow soldering the assembly to form the solder joint, wherein the formed solder joint has a liquidus temperature higher than a peak reflow soldering temperature used during reflow soldering.

Other features and aspects of the invention will become apparent from the following detailed description, taken in conjunction with the accompanying drawings, which illustrate, by way of example, the features in accordance with embodiments of the invention. The summary is not intended to limit the scope of the invention, which is defined solely by the claims attached hereto.

BRIEF DESCRIPTION OF THE DRAWINGS

The technology disclosed herein, in accordance with one or more various embodiments, is described in detail with reference to the included figures. The figures are provided for purposes of illustration only and merely depict example implementations. Furthermore, it should be noted that for clarity and ease of illustration, the elements in the figures have not necessarily been drawn to scale.

The figures are not intended to be exhaustive or to limit the invention to the precise form disclosed. It should be understood that the invention can be practiced with modification and alteration, and that the disclosed technology be limited only by the claims and the equivalents thereof.

DETAILED DESCRIPTION OF THE EMBODIMENTS

The technology disclosed herein is directed to mixed solder powder pastes for soldering applications. The mixed solder powder pastes may be particularly suitable for low temperature to middle temperature soldering applications (e.g., soldering applications having a peak soldering temperature, significantly lower than the melting temperature of a traditional SnAgCu solder, namely at or below 200° C.) In accordance with implementations described herein, the solder paste may include at least two solder powder alloys having significantly different solidus temperatures. The solder paste may be designed for reflow at a peak temperature below the solidus temperature of the higher solidus temperature solder powder but above the melting temperature of the lower one.

During reflow, the lower solidus temperature solder powder may completely melt. At the same time, the higher solidus temperature solder powder may partially dissolve into the molten solder during reflow. After solidification, the solder joint may include a seamless interface between a matrix and remaining higher solidus temperature solder powder. The remaining amount of the higher solidus temperature solder powder embedded in the solder matrix with the seamless interface may improve mechanical performance by acting as in situ reinforcing phases with no interfacial singularity.

In accordance with implementations, the higher solidus temperature solder powder may have at least one major constituent element that is also a major constituent element in the lower solidus temperature solder powder. This may allow the continuous dissolution of the higher solidus temperature solder powder into the liquid solution and obviate the need to form an interfacial IMC between the surface of the higher solidus temperature solder powder and the liquid solution.

The liquidus temperature of the solder joint formed by mixed solder powder pastes in accordance with the disclosure may be much higher than that of the lower solidus temperature solder powder because of the partial dissolution of the higher solidus temperature solder powder. In some implementations, the solder joint may even exhibit a higher solidus temperature than that of the lower solidus temperature solder powder. By virtue of the implementations described herein, the solder paste may reflow at a relatively low peak temperature while the reflowed joint may achieve a liquidus temperature or even solidus temperature that is close to or higher than that of the peak reflow temperature.

Figure 1:
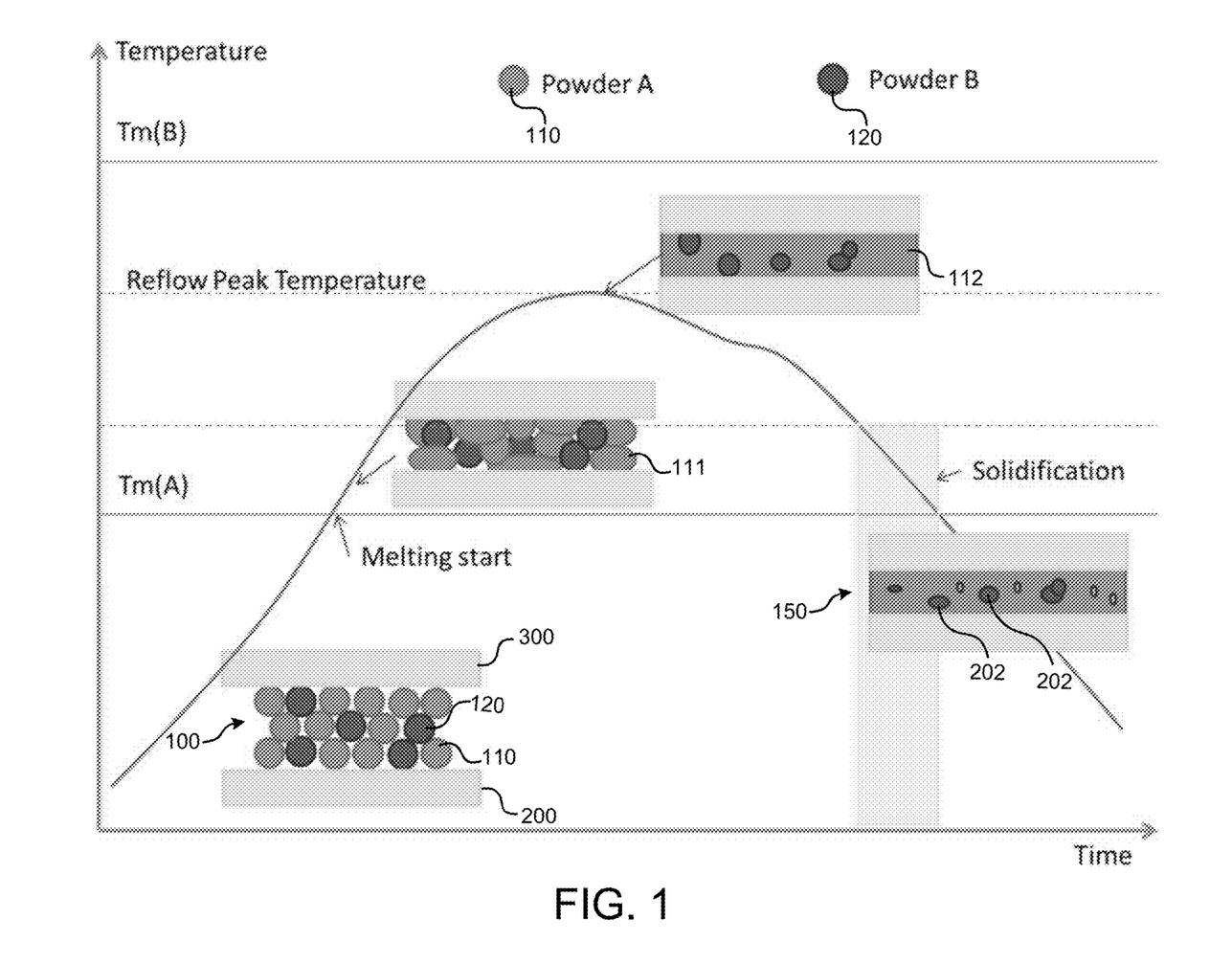
FIG. 1 illustrates a reflow solder process using a solder paste, in accordance with implementations of the disclosure.

FIG. 1 illustrates a reflow solder process using a solder paste 100 in accordance with implementations of the disclosure. Solder paste 100 includes flux (not illustrated), a solder powder 110 having a solidus temperature Tm(A), and solder powder 120 having a solidus temperature Tm(B), where Tm(B) is greater than Tm(A). As depicted by FIG. 1, the peak reflow temperature exceeds the liquidus temperature of solder powder 110 but falls below the solidus temperature of solder powder 120.

Prior to reflow, solder paste 100 may be placed between components 200 and 300 to form an assembly. For example, solder paste 100 may be placed between two pads (e.g., Cu pads). As another example, the solder paste 100 may be placed on a component 200 that is a substrate (e.g., Cu or Ni substrate), and a component 300 that is a device (e.g., die) may be placed on the solder paste 100 to form an assembly. When the reflow temperature increases to beyond Tm(A), the solder powder 110 having solidus temperature Tm(A) will begin to melt, becoming a molten solder 111. The molten solder 111 will begin to spread and wet on the bonding surface of components 200 and 300. For example, the molten solder may wet on a jointing surface and react with the surface's metallization to form interfacial intermetallic compounds (IMCs). At the same time, the higher solidus temperature powder 120 begins to dissolve into the molten solder. As reflow continues, the molten solder 111 will completely melt and become a liquid structure 112 while the higher solidus temperature powder continues to dissolve into the molten solder, forming a homogenous liquid solution. The continuous dissolution of solder powder 120 may significantly change the composition of the liquid solution.

As the assembly is cooled, the molten liquid solidifies, and a solder joint 150 is formed between components 200 and 300. Enough of the powder 120 may remain embedded after reflow soldering in the form of reinforcing colonies 202. After solidification, the joint 150 may form with the morphology of embedded colonies 202 inside the solder matrix, providing reinforcement towards this matrix.

Due to the dissolution of powder 120, joint 150 may exhibit a liquidus temperature that is about the same as or even higher than the peak reflow temperature. In some implementations, the joint 150 may also have a higher solidus temperature than that of powder 110 (i.e., higher than Tm(A)).

In contrast to the TLPB technology that may achieve a higher remelting temperature of a solder joint through the formation of IMCs, the present design does not require the formation of any IMC between the solder powder 110 in molten form and the solder powder 120 in solid form. Rather, the solder paste may be reflowed at a peak reflow temperature such that the higher melting point powder continuously and partially dissolves into the molten lower melting point one to form a homogenous liquid solution during the reflow process. No discontinuous interfaces may be created. Instead, the remaining solder powder 120 may form colonies 202 with the joint matrix that provide reinforcement to the solder joint 150. The transition zone between these colonies and the matrix may have the same compositional gradient due to a compositional difference of powders 110 and 120. The existence of this transition zone may minimize interfacial effects and reduce risk of a weak interface due to IMC growth. The ratio of the constituent powders and powder sizes may be controlled to allow the existence of the remaining high melting phase colonies after reflow and solidification, which would improve mechanical performance.

In accordance with various implementations of the disclosure, the mixed lead-free solder paste may consist of an amount of the lower solidus temperature solder alloy powder between 44 wt % and 83 wt %, an amount of the higher solidus temperature solder alloy powder between 5 wt % to 44 wt %, and a remainder of flux. As noted above, the higher solidus temperature solder powder may have at least one same major constituent element as that in the lower solidus temperature solder powder, which allows the continuous dissolution of the higher solidus temperature solder powder into the liquid solution during reflow soldering.

In accordance with some implementations, the lower solidus temperature solder alloy may be In—Sn, Bi—Sn, an In—Sn alloy, or a Bi—Sn alloy. In some implementations, the lower solidus temperature solder alloy may be In—Sn eutectic (52In48Sn) or Bi—Sn eutectic (58Bi42Sn).

The In—Sn alloy may be In—Sn—Ag, In—Sn—Cu, or In—Sn—Ag—Cu. In some In—Sn—Ag implementations, the alloy may be comprised from 10 wt % to 52 wt % In, 0.1 wt % to 3.8 wt % Ag, with the remainder being Sn. In some In—Sn—Cu implementations, the alloy may be comprised from 10 wt % to 52 wt % In, 0.1 wt % to 1.2 wt % Cu, with the remainder being Sn. In some In—Sn—Ag—Cu implementations, the alloy may be comprised from 10 wt % to 52 wt % In, 0.01 to 3.8 wt % Ag, 0.1 to 1.2 wt % Cu, with the remainder being Sn. In some implementations, the In—Sn, In—Sn—Ag, In—Sn—Ag, In—Sn—Cu, and In—Sn—Ag—Cu alloys may have one or more dopants. The dopants may include Sb, Bi, Ni, Co, Mn, P and Zn. The dopants may range from 0.001 wt % to 3 wt %.

The Bi—Sn alloy may be Bi—Sn—Ag, Bi—Sn—Cu, or Bi—Sn—Ag—Cu. In some Bi—Sn—Ag implementations, the alloy may be comprised from 40 wt % to 65 wt % Bi, 0.1 wt % to 2 wt % Ag, with the remainder being Sn. In some Bi—Sn—Cu implementations, the alloy may be comprised from 40 wt % to 65 wt % Bi, 0.1 wt % to 1.2 wt % Cu, with the remainder being Sn. In some Bi—Sn—Ag—Cu implementations, the alloy may be comprised from 40 wt % to 65 wt % Bi, 0.1 wt % to 2 wt % Ag, 0.1 wt % to 1.2 wt % Cu, with the remainder being Sn. In some implementations, the Bi—Sn, Bi—Sn—Ag, Bi—Sn—Cu, and Bi—Sn—Ag—Cu alloys may have one or more dopants. The dopants may include Sb, In, Ni, Co, Mn, P and Zn. The dopants may range from 0.001 wt % to 3 wt %.

In accordance with some implementations, the higher solidus temperature solder alloy may be Sn—Ag, Sn—Cu, Sn—Ag—Cu, an Sn—Ag alloy, an Sn—Cu alloy, or an Sn—Ag—Cu alloy. In some implementations, the higher solidus temperature solder alloy may be Sn—Ag eutectic (96.5Sn3.5Ag), Sn—Cu eutectic (99.3Sn0.7Cu), or Sn—Ag—Cu eutectic (95.5Sn3.8Ag0.7Cu) or near-eutectic Sn—Ag—Cu (96.5Sn3.0Ag0.5Cu).

In some implementations, the higher solidus temperature solder alloy may be a Sn—Ag, Sn—Cu, or Sn—Ag—Cu alloy having one or more dopants. The dopants may include one or more of Sb, Bi, In, Ni, Co, Mn, P and Zn. In some implementations, the higher solidus temperature solder alloy is Sn—Ag—X (X=Sb, Bi, In, Ni, Co, Mn, P and Zn) comprised of 0.1 wt % to 3.8 wt % Ag, 0.001 wt % to 10 wt % of X, with the remainder being Sn. In some implementations, the higher solidus temperature solder alloy is Sn—Cu—X (X=Sb, Bi, In, Ni, Co, Mn, P and Zn) comprised of 0.1 wt % to 1.2 wt % Cu, 0.001 wt % to 10 wt % of X, with the remainder being Sn. In some implementations, the higher solidus temperature solder alloy is Sn—Ag—Cu—X (X=Sb, Bi, In, Ni, Co, Mn, P and Zn) comprised of 0.1 wt % to 3.8 wt % of Ag, 0.1 wt % to 1.2 wt % Cu, 0.001 wt % to 10 wt % of X, with the remainder being Sn.

In accordance with some implementations, the higher solidus temperature solder alloy may be Sn—Sb or Sn—Sb—Y (Y=Ag, Cu, Bi, In, Ni, Co, Mn, P and Zn). In Sn—Sb implementations, the alloy may be comprised of 0.5 wt % to 10 wt % Sb, with the remainder being Sn. In Sn—Sb—Y (Y=Ag, Cu, Bi, In, Ni, Co, Mn, P and Zn) implementations, the alloy may be comprised of 0.5 wt % to 10 wt % Sb, 0.001 wt % to 5 wt % of Y, with the remainder being Sn.

In accordance with implementations of a mixed solder paste having a Sn-rich solder and Sn—In alloys, the Sn-rich solder may be harder than Sn—In alloys. The existence of Sn-rich solder colonies within an Sn—In matrix may harden the solder joint.

In accordance with implementations of a mixed solder paste having a Sn-rich solder and Bi—Sn alloys, the Sn-rich solder may be comparable in strength but more ductile than Bi—Sn. The existence of Sn-rich solder colonies within a Bi—Sn matrix may maintain solder joint strength but improve ductility. Additionally, the existence of Sn-rich colonies may interfere with the distribution of Bi because the diffusion of Bi into the high melting Sn-rich solder is much slower as depicted in FIG. 4A.

Figure 2:
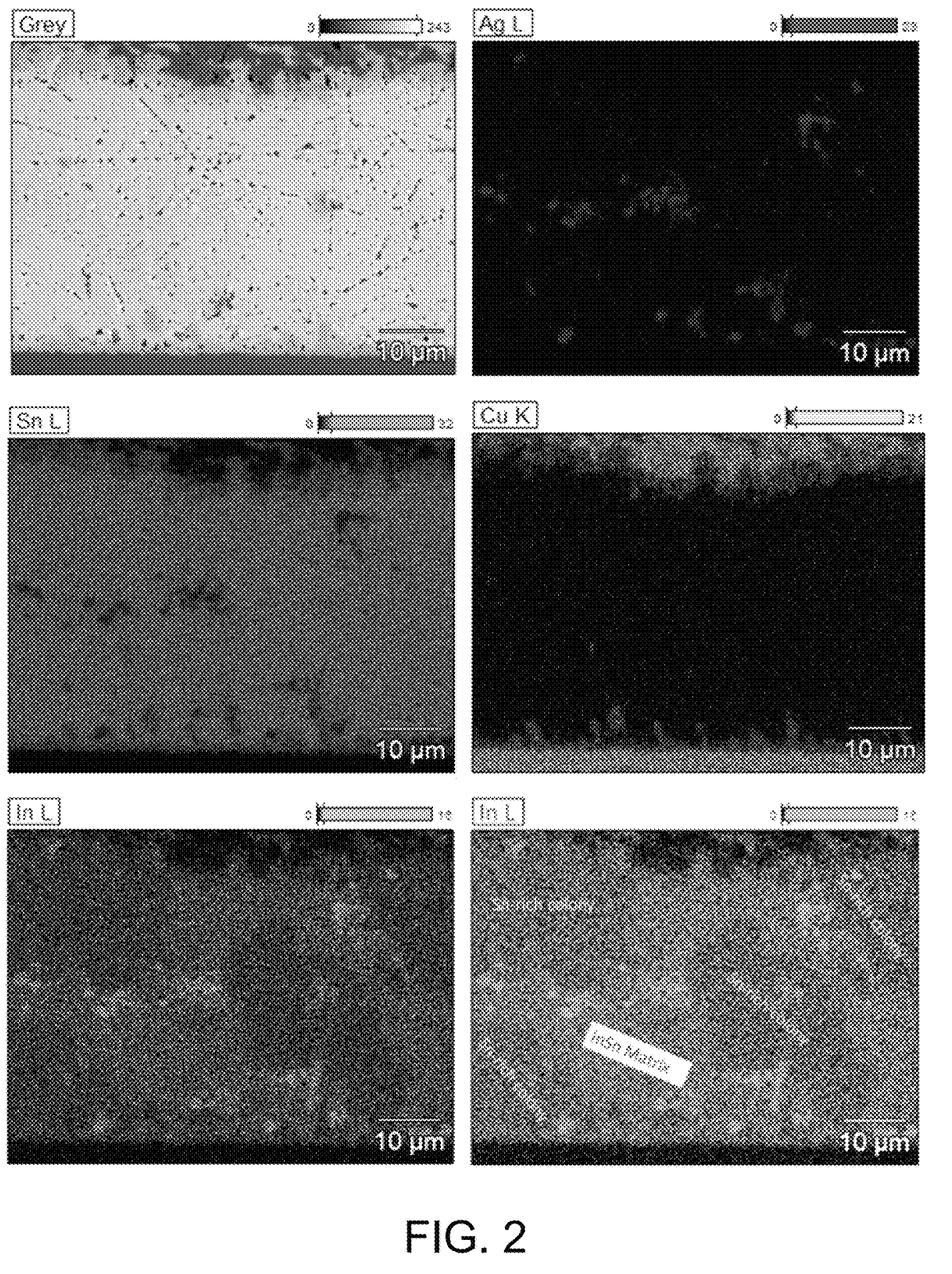
FIG. 2 illustrates a morphology of a solder joint formed by reflow soldering a solder paste including a 77.2Sn20In2.8Ag powder and a Sn3.0Ag0.5Cu powder, in accordance with implementations of the disclosure.

FIG. 2 illustrates a morphology of a solder joint formed by reflow soldering a solder paste including a 77.2Sn20In2.8Ag powder and a Sn3.0Ag0.5Cu powder, in accordance with implementations of the disclosure. In this example, the joint is between two Cu pads. The joint was reflowed at a peak temperature of 200° C., higher than the solidus temperature of 77.2Sn20In2.8Ag (114° C.) but lower than the solidus temperature of Sn3.0Ag0.5Cu (217° C.). In this example, Sn-rich colonies surrounded by an InSn-matrix are clearly identified by EDX mapping.

Figure 3:
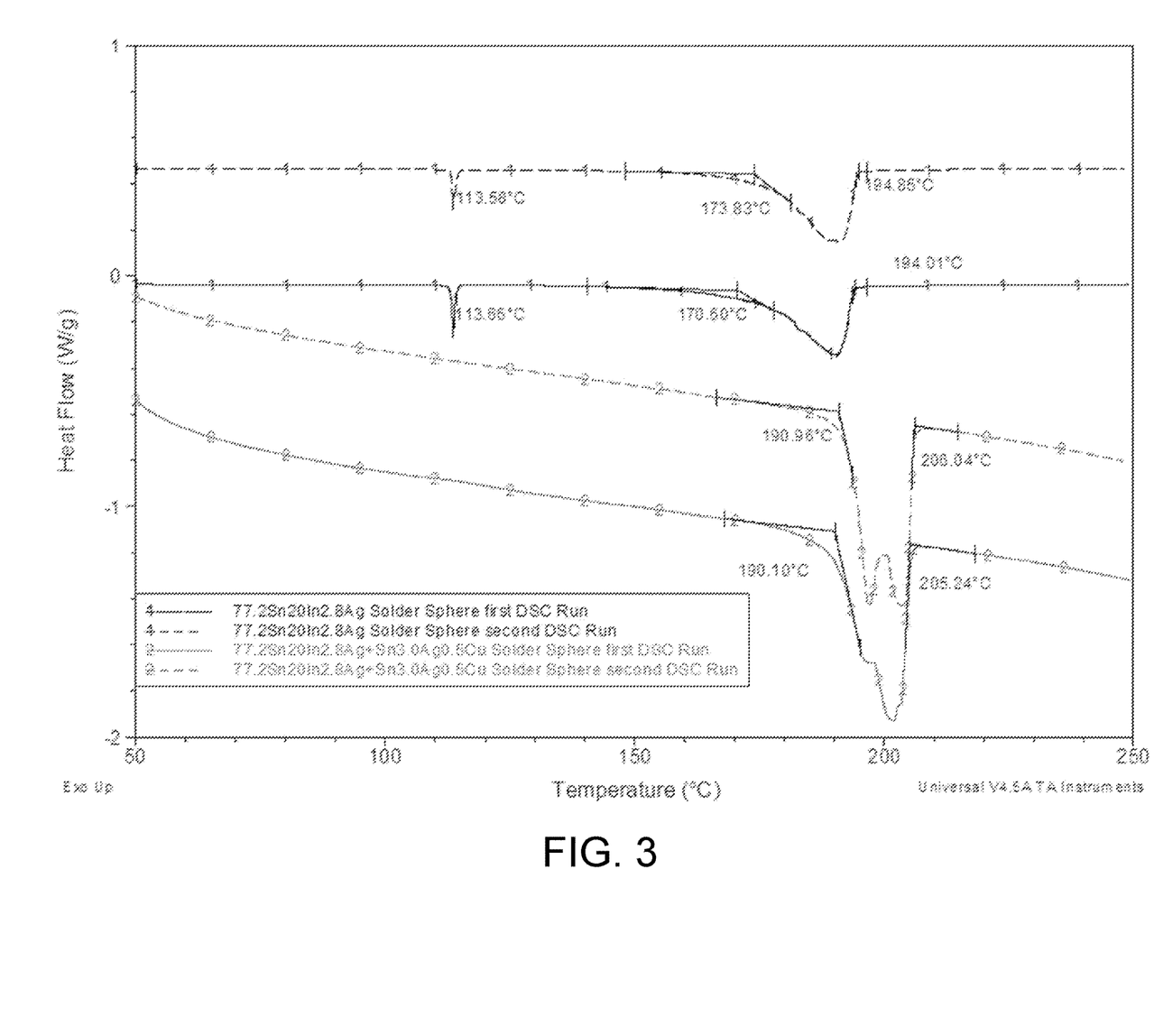
FIG. 3 is a plot showing differential scanning calorimetry (DSC) curves from solder spheres reflowed at a peak temperature of 200° C. using: (i) a 77.2Sn20In2.8Ag solder paste; and (ii) a mixed solder paste including a 77.2Sn20In2.8Ag solder and a Sn3.0Ag0.5Cu solder.

FIG. 3 is a plot showing differential scanning calorimetry (DSC) curves from solder spheres reflowed at a peak temperature of 200° C. using: (i) a 77.2Sn20In2.8Ag solder paste; and (ii) a mixed solder paste including a 77.2Sn20In2.8Ag solder and a Sn3.0Ag0.5Cu solder. As shown, the low melting peak around 114° C. is present for the 77.2Sn20In2.8Ag solder paste while it is absent for the mixed solder paste. The solidus temperature of the solder sphere reflowed from the mixed solder paste is higher, at about 190° C. The liquidus temperature of the 77.2Sn20In2.8Ag solder paste is about 194° C. whereas the liquidus temperature of the mixed solder paste is about 205° C., even higher than the peak reflow temperature.

Figure 4A:
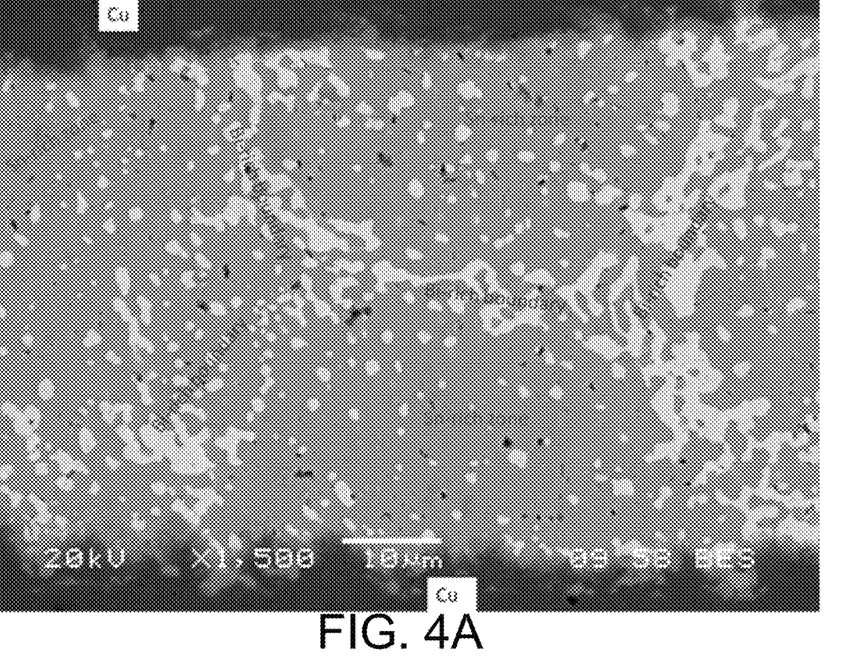
FIG. 4A is a micrograph showing a microstructure of a solder joint between two Cu pads formed by reflow soldering a solder paste including a 57Bi42Sn1Ag powder and a Sn3.0Ag0.5Cu powder, in accordance with implementations of the disclosure.

FIG. 4A is a micrograph showing a microstructure of a solder joint between two Cu pads formed by reflow soldering a solder paste including a 57Bi42Sn1Ag powder and a Sn3.0Ag0.5Cu powder, in accordance with implementations of the disclosure. In this example, the solder joint was reflowed at a peak temperature of 170° C., which is higher than the solidus temperature of 57Bi42Sn1Ag (139° C.) but lower than the solidus temperature of Sn3.0Ag0.5Cu (217° C.). The majority of the Bi-rich phase (bright area) in the joint is enriched between Sn-rich colonies to form Bi-rich boundaries, although Bi is still diffused into Sn-rich colonies during reflow and precipitated as particles inside the colonies.

Figure 4B:
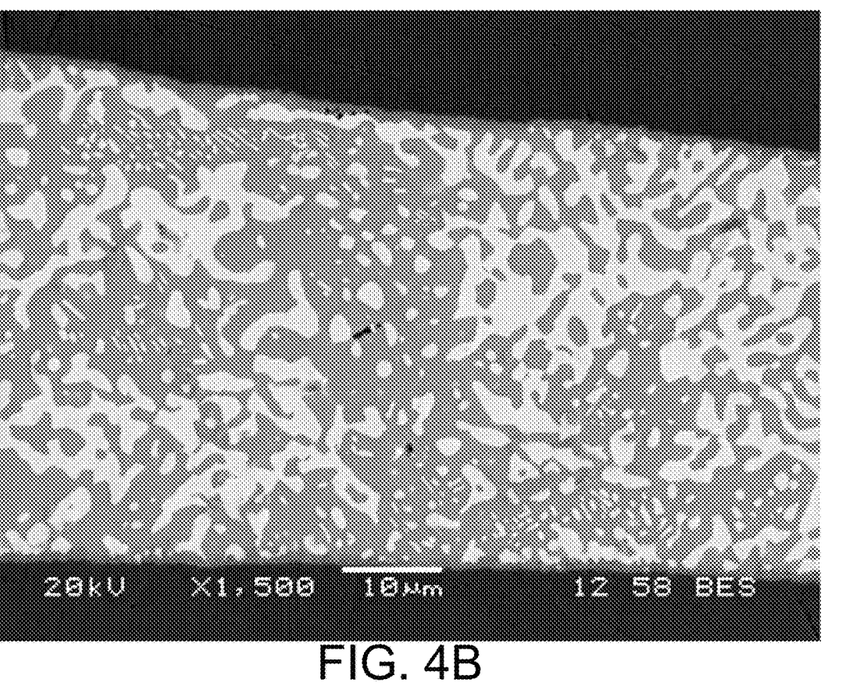
FIG. 4B is a micrograph showing a microstructure of a solder joint between two Cu pads formed by reflow soldering a 57Bi42Sn1Ag solder paste.

FIG. 4B is a micrograph showing a microstructure of a solder joint between two Cu pads formed by reflow soldering a 57Bi42Sn1Ag solder paste. By comparison, the solder joint formed with the 57Bi42Sn1Ag solder paste exhibits a homogeneous microstructure instead of the clear boundary between Sn-rich and Bi-rich zones shown in FIG. 4A. In addition, the interfacial IMC morphology of the solder joint formed with the mixed powder solder paste is different from that of the solder joint formed with the 57Bi42Sn1Ag solder paste. Instead of forming the continuous interfacial IMCs for 57Bi42Sn1Ag as depicted in FIG. 4B, the joint in FIG. 4A shows separated IMC scallops along the bonding interface. Even IMCs are penetrated into the Cu pad surface. Additionally, Bi is seldom seen at the bonding interface of the joint of the mixed powder solder paste while Bi phases are enriched along the bonding interface for joint of the 57Bi42Sn1Ag solder paste.

Figure 5:
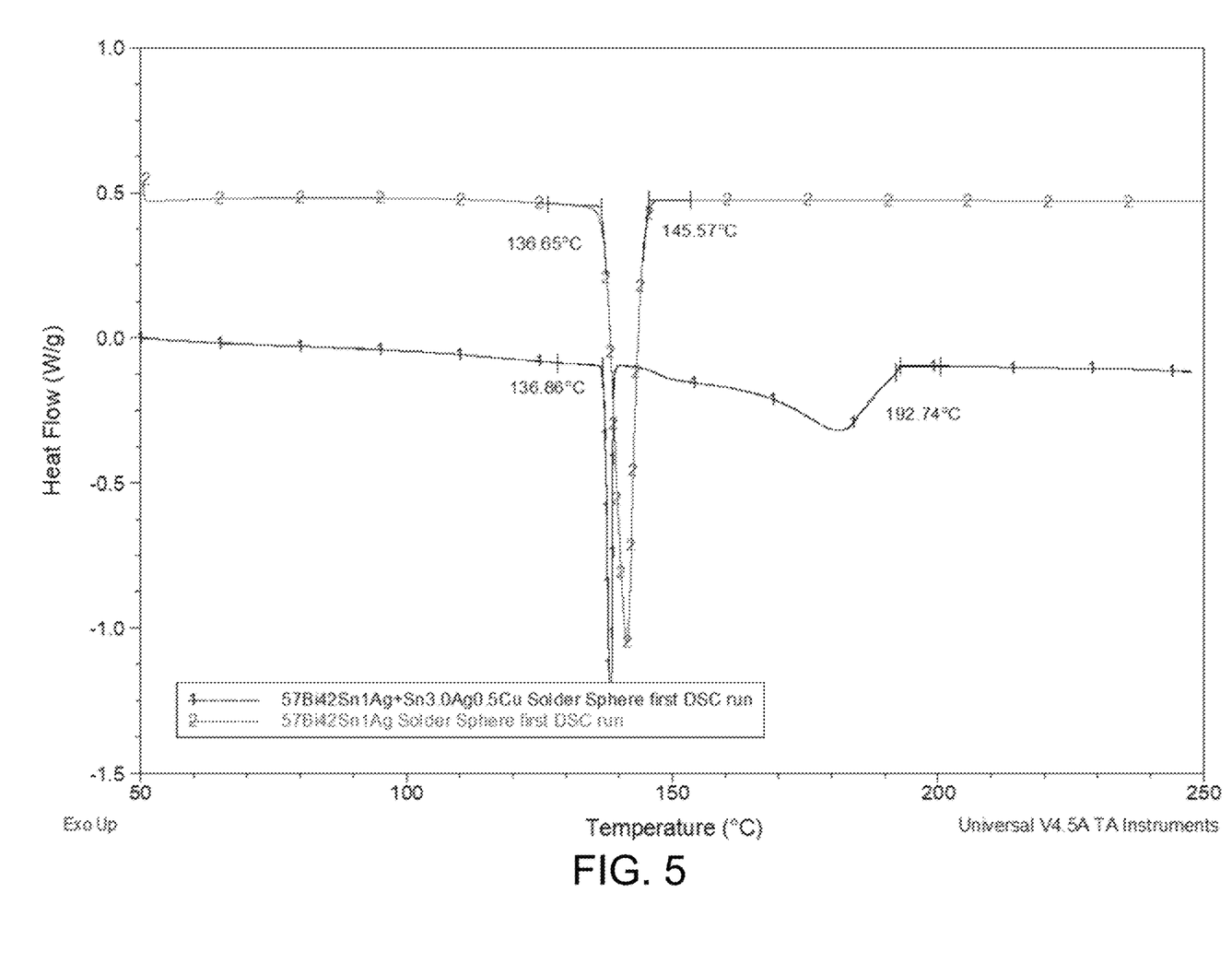
FIG. 5 is a plot showing DSC curves from solder spheres reflowed at a peak temperature of 170° C. using: (i) a 57Bi42Sn1Ag solder paste; and (ii) a mixed solder paste including a 57Bi42Sn1Ag solder and a Sn3.0Ag0.5Cu solder.

FIG. 5 is a plot showing DSC curves from solder spheres reflowed at a peak temperature of 170° C. using: (i) a 57Bi42Sn1Ag solder paste; and (ii) a mixed solder paste including a 57Bi42Sn1Ag solder and a Sn3.0Ag0.5Cu solder. After reflow, the solidus temperature for both spheres is similar at around 137° C. By contrast, the solder sphere from the mixed solder paste shows a liquidus temperature of around 192° C., which is much higher the peak reflow temperature of 170° C.

Table 1, below, illustrates example compositions of a lead-free mixed solder powder paste where the lower solidus temperature solder alloy is 77.2Sn-20In-2.8Ag and the higher solidus temperature solder alloy is an Sn-rich solder alloy, in accordance with implementations of the disclosure.

TABLE 1

| 77.2Sn20In2.8Ag | 96.5Sn3.0Ag0.5Cu | Sn5Sb | Sn3.2Ag0.5Cu5.5Sb | Sn3.5Ag | Flux |
|---|---|---|---|---|---|
| 80 wt % | 8 wt % | | | | 12 wt % |
| 75 wt % | 13 wt % | | | | 12 wt % |
| 70 wt % | 18 wt % | | | | 12 wt % |
| 65 wt % | 23 wt % | | | | 12 wt % |
| 60 wt % | 28 wt % | | | | 12 wt % |
| 55 wt % | 33 wt % | | | | 12 wt % |
| 50 wt % | 38 wt % | | | | 12 wt % |
| 44 wt % | 44 wt % | | | | 12 wt % |
| 80 wt % | | 8 wt % | | | 12 wt % |
| 75 wt % | | 13 wt % | | | 12 wt % |
| 70 wt % | | 18 wt % | | | 12 wt % |
| 65 wt % | | 23 wt % | | | 12 wt % |
| 60 wt % | | 28 wt % | | | 12 wt % |
| 55 wt % | | 33 wt % | | | 12 wt % |
| 50 wt % | | 38 wt % | | | 12 wt % |
| 44 wt % | | 44 wt % | | | 12 wt % |
| 80 wt % | | | 8 wt % | | 12 wt % |
| 75 wt % | | | 13 wt % | | 12 wt % |
| 70 wt % | | | 18 wt % | | 12 wt % |
| 65 wt % | | | 23 wt % | | 12 wt % |
| 60 wt % | | | 28 wt % | | 12 wt % |
| 55 wt % | | | 33 wt % | | 12 wt % |
| 50 wt % | | | 38 wt % | | 12 wt % |
| 44 wt % | | | 44 wt % | | 12 wt % |
| 80 wt % | | | | 8 wt % | 12 wt % |
| 75 wt % | | | | 13 wt % | 12 wt % |
| 70 wt % | | | | 18 wt % | 12 wt % |
| 65 wt % | | | | 23 wt % | 12 wt % |
| 60 wt % | | | | 28 wt % | 12 wt % |
| 55 wt % | | | | 33 wt % | 12 wt % |
| 50 wt % | | | | 38 wt % | 12 wt % |
| 44 wt % | | | | 44 wt % | 12 wt % |

Table 2, below, illustrates example compositions of a lead-free mixed solder powder paste where the lower solidus temperature solder alloy is 57Bi-42Sn-1Ag and the higher solidus temperature solder alloy is an Sn-rich solder alloy, in accordance with implementations of the disclosure.

TABLE 2

| 57Bi42Sn1Ag | 96.5Sn3.0Ag0.5Cu | Sn5Sb | Sn3.2Ag0.5Cu5.5Sb | Sn3.5Ag | Flux |
|---|---|---|---|---|---|
| 80 wt % | 8 wt % | | | | 12 wt % |
| 75 wt % | 13 wt % | | | | 12 wt % |
| 70 wt % | 18 wt % | | | | 12 wt % |
| 65 wt % | 23 wt % | | | | 12 wt % |
| 60 wt % | 28 wt % | | | | 12 wt % |
| 55 wt % | 33 wt % | | | | 12 wt % |
| 50 wt % | 38 wt % | | | | 12 wt % |
| 44 wt % | 44 wt % | | | | 12 wt % |
| 80 wt % | | 8 wt % | | | 12 wt % |
| 75 wt % | | 13 wt % | | | 12 wt % |
| 70 wt % | | 18 wt % | | | 12 wt % |
| 65 wt % | | 23 wt % | | | 12 wt % |
| 60 wt % | | 28 wt % | | | 12 wt % |
| 55 wt % | | 33 wt % | | | 12 wt % |
| 50 wt % | | 38 wt % | | | 12 wt % |
| 44 wt % | | 44 wt % | | | 12 wt % |
| 80 wt % | | | 8 wt % | | 12 wt % |
| 75 wt % | | | 13 wt % | | 12 wt % |
| 70 wt % | | | 18 wt % | | 12 wt % |
| 65 wt % | | | 23 wt % | | 12 wt % |

TABLE 2-continued

| 57Bi42Sn1Ag | 96.5Sn3.0Ag0.5Cu | Sn5Sb | Sn3.2Ag0.5Cu5.5Sb | Sn3.5Ag | Flux |
|---|---|---|---|---|---|
| 60 wt % | | | 28 wt % | | 12 wt % |
| 55 wt % | | | 33 wt % | | 12 wt % |
| 50 wt % | | | 38 wt % | | 12 wt % |
| 44 wt % | | | 44 wt % | | 12 wt % |
| 80 wt % | | | | 8 wt % | 12 wt % |
| 75 wt % | | | | 13 wt % | 12 wt % |
| 70 wt % | | | | 18 wt % | 12 wt % |
| 65 wt % | | | | 23 wt % | 12 wt % |
| 60 wt % | | | | 28 wt % | 12 wt % |
| 55 wt % | | | | 33 wt % | 12 wt % |
| 50 wt % | | | | 38 wt % | 12 wt % |
| 44 wt % | | | | 44 wt % | 12 wt % |

Table 3, below, illustrates example compositions of a lead-free mixed solder powder paste where the lower solidus temperature solder alloy is 48In-52Sn and the higher solidus temperature solder alloy is an Sn-rich solder alloy, in accordance with implementations of the disclosure.

TABLE 3

| 48In52Sn | 96.5Sn3.0Ag0.5Cu | Sn5Sb | Sn3.2Ag0.5Cu5.5Sb | Sn3.5Ag | Flux |
|---|---|---|---|---|---|
| 80 wt % | 8 wt % | | | | 12 wt % |
| 75 wt % | 13 wt % | | | | 12 wt % |
| 70 wt % | 18 wt % | | | | 12 wt % |
| 65 wt % | 23 wt % | | | | 12 wt % |
| 60 wt % | 28 wt % | | | | 12 wt % |
| 55 wt % | 33 wt % | | | | 12 wt % |
| 50 wt % | 38 wt % | | | | 12 wt % |
| 44 wt % | 44 wt % | | | | 12 wt % |
| 80 wt % | | 8 wt % | | | 12 wt % |
| 75 wt % | | 13 wt % | | | 12 wt % |
| 70 wt % | | 18 wt % | | | 12 wt % |
| 65 wt % | | 23 wt % | | | 12 wt % |
| 60 wt % | | 28 wt % | | | 12 wt % |
| 55 wt % | | 33 wt % | | | 12 wt % |
| 50 wt % | | 38 wt % | | | 12 wt % |
| 44 wt % | | 44 wt % | | | 12 wt % |
| 80 wt % | | | 8 wt % | | 12 wt % |
| 75 wt % | | | 13 wt % | | 12 wt % |
| 70 wt % | | | 18 wt % | | 12 wt % |
| 65 wt % | | | 23 wt % | | 12 wt % |
| 60 wt % | | | 28 wt % | | 12 wt % |
| 55 wt % | | | 33 wt % | | 12 wt % |
| 50 wt % | | | 38 wt % | | 12 wt % |
| 44 wt % | | | 44 wt % | | 12 wt % |
| 80 wt % | | | | 8 wt % | 12 wt % |
| 75 wt % | | | | 13 wt % | 12 wt % |
| 70 wt % | | | | 18 wt % | 12 wt % |
| 65 wt % | | | | 23 wt % | 12 wt % |
| 60 wt % | | | | 28 wt % | 12 wt % |
| 55 wt % | | | | 33 wt % | 12 wt % |
| 50 wt % | | | | 38 wt % | 12 wt % |
| 44 wt % | | | | 44 wt % | 12 wt % |

While various embodiments of the disclosed technology have been described above, it should be understood that they have been presented by way of example only, and not of limitation. Likewise, the various diagrams may depict an example architectural or other configuration for the disclosed technology, which is done to aid in understanding the features and functionality that can be included in the disclosed technology. The disclosed technology is not restricted to the illustrated example architectures or configurations, but the desired features can be implemented using a variety of alternative architectures and configurations. Indeed, it will be apparent to one of skill in the art how alternative functional, logical or physical partitioning and configurations can be implemented to implement the desired features of the technology disclosed herein. Also, a multitude of different constituent module names other than those depicted herein can be applied to the various partitions. Additionally, with regard to flow diagrams, operational descriptions and method claims, the order in which the steps are presented herein shall not mandate that various embodiments be implemented to perform the recited functionality in the same order unless the context dictates otherwise.

Although the disclosed technology is described above in terms of various exemplary embodiments and implementations, it should be understood that the various features, aspects and functionality described in one or more of the individual embodiments are not limited in their applicability to the particular embodiment with which they are described, but instead can be applied, alone or in various combinations, to one or more of the other embodiments of the disclosed technology, whether or not such embodiments are described and whether or not such features are presented as being a part of a described embodiment. Thus, the breadth and scope of the technology disclosed herein should not be limited by any of the above-described exemplary embodiments.

Terms and phrases used in this document, and variations thereof, unless otherwise expressly stated, should be construed as open ended as opposed to limiting. As examples of the foregoing: the term "including" should be read as meaning "including, without limitation" or the like; the term "example" is used to provide exemplary instances of the item in discussion, not an exhaustive or limiting list thereof; the terms "a" or "an" should be read as meaning "at least one," "one or more" or the like; and adjectives such as "conventional," "traditional," "normal," "standard," "known" and terms of similar meaning should not be construed as limiting the item described to a given time period or to an item available as of a given time, but instead should be read to encompass conventional, traditional, normal, or standard technologies that may be available or known now or at any time in the future. Likewise, where this document refers to technologies that would be apparent or known to one of ordinary skill in the art, such technologies encompass those apparent or known to the skilled artisan now or at any time in the future.

The presence of broadening words and phrases such as "one or more," "at least," "but not limited to" or other like phrases in some instances shall not be read to mean that the narrower case is intended or required in instances where such broadening phrases may be absent. The use of the term "module" does not imply that the components or functionality described or claimed as part of the module are all configured in a common package. Indeed, any or all of the various components of a module, whether control logic or other components, can be combined in a single package or separately maintained and can further be distributed in multiple groupings or packages or across multiple locations.

Additionally, the various embodiments set forth herein are described in terms of exemplary block diagrams, flow charts and other illustrations. As will become apparent to one of ordinary skill in the art after reading this document, the illustrated embodiments and their various alternatives can be implemented without confinement to the illustrated examples. For example, block diagrams and their accompanying description should not be construed as mandating a particular architecture or configuration.

What is claimed is:

1. A solder paste, comprising:
    44 wt % to 83 wt % of a first solder alloy powder selected from the group consisting of:
        10 wt % to 52 wt % In, 0.1 wt % to 1.2 wt % Cu, optionally, 0.001 wt % to 3 wt % of Sb, Bi, Ni, Co, Mn, P, or Zn, and a remainder of Sn;
        10 wt % to 52 wt % In, 0.01 wt % to 3.8 wt % Ag, 0.1 wt% to 1.2 wt % Cu, optionally, 0.001 wt % to 3 wt % of Sb, Bi, Ni, Co, Mn, P, or Zn, and a remainder of Sn;
        52In48Sn;
        40 wt % to 65 wt % Bi, 0.1 wt % to 1.2 wt % Cu, optionally, 0.001 wt % to 3 wt % of Sb, In, Ni, Co, Mn, P, or Zn, and a remainder of Sn; and
        40 wt % to 65 wt % Bi, 0.1 wt % to 2 wt % Ag, 0.1 wt % to 1.2 wt % Cu, optionally, 0.001 wt % to 3 wt % of Sb, In, Ni, Co, Mn, P, or Zn, and a remainder of Sn;
    5 wt % to 44 wt % of a second solder alloy powder selected from the group consisting of Sn—Ag, Sn—Cu, Sn—Ag—Cu, Sn—Sb, an Sn—Ag alloy, an Sn—Cu alloy, an Sn—Ag—Cu alloy, and an Sn—Sb alloy, wherein the first solder alloy powder has a liquidus temperature lower than a solidus temperature of the second solder alloy powder; and
    flux.

2. The solder paste of claim 1, wherein the first solder alloy powder is:
    10 wt % to 52 wt % In, 0.1 wt % to 1.2 wt % Cu, optionally, 0.001 wt % to 3 wt % of Sb, Bi, Ni, Co, Mn, P, or Zn, and a remainder of Sn; or
    10 wt % to 52 wt % In, 0.01wt % to 3.8 wt % Ag, 0.1 wt % to 1.2 wt % Cu, optionally, 0.001 wt % to 3 wt % of Sb, Bi, Ni, Co, Mn, P, or Zn, and a remainder of Sn.

3. The solder paste of claim 2, wherein the first solder alloy powder is 10 wt % to 52 wt % In, 0.1 wt % to 1.2 wt % Cu, optionally, 0.001 wt % to 3 wt % of Sb, Bi, Ni, Co, Mn, P, or Zn, and a remainder of Sn.

4. The solder paste of claim 3, wherein the first solder alloy powder is 10 wt % to 52 wt % In, 0.1 wt % to 1.2 wt % Cu, and a remainder of Sn.

5. The solder paste of claim 2, wherein the first solder alloy powder is 10 wt % to 52 wt % In, 0.01 wt % to 3.8 wt % Ag, 0.1 wt % to 1.2 wt % Cu, optionally, 0.001 wt % to 3 wt % of Sb, Bi, Ni, Co, Mn, P, or Zn, and a remainder of Sn.

6. The solder paste of claim 5, wherein the first solder alloy powder is 10 wt % to 52 wt % In, 0.01 wt % to 3.8 wt % Ag, 0.1 wt % to 1.2 wt % Cu, and a remainder of Sn.

7. The solder paste of claim 1, wherein the first solder alloy powder is:
    40 wt % to 65 wt % Bi, 0.1 wt % to 1.2 wt % Cu, optionally, 0.001 wt % to 3 wt % of Sb, In, Ni, Co, Mn, P, or Zn, with a remainder of Sn; or
    40 wt % to 65 wt % Bi, 0.1 wt % to 2 wt % Ag, 0.1 wt % to 1.2 wt % Cu, optionally, 0.001 wt % to 3 wt % of Sb, In, Ni, Co, Mn, P, or Zn, with a remainder of Sn.

8. The solder paste of claim 1 wherein the first solder alloy powder is 52In48Sn.

9. The solder paste of claim 1, wherein the first solder alloy powder comprises 0.001 wt % to 3 wt % of Sb, Bi, In, Ni, Co, Mn, P, or Zn.

10. The solder paste of claim 1, wherein the second solder alloy powder is Sn—Ag, Sn—Cu, Sn—Ag—Cu, an Sn—Ag alloy, an Sn—Cu alloy, or an Sn—Ag—Cu alloy.

11. The solder paste of claim 10, wherein the second solder alloy powder is:
    Sn—Ag—X (X=Sb, Bi, In, Ni, Co, Mn, P or Zn) consisting of 0.1 wt % to 3.8 wt % Ag, 0.001 wt % to 10 wt % of X, and a remainder of Sn;
    Sn—Cu—X (X=Sb, Bi, In, Ni, Co, Mn, P or Zn) consisting of 0.1 wt % to 1.2 wt % Cu, 0.001 wt % to 10 wt % of X, and a remainder of Sn; or
    Sn—Ag—Cu—X (X=Sb, Bi, In, Ni, Co, Mn, P or Zn) consisting of 0.1 wt % to 3.8 wt % of Ag, 0.1 wt % to 1.2 wt % Cu, 0.001 wt % to 10 wt % of X, and a remainder of Sn.

12. The solder paste of claim 10, wherein the second solder alloy powder is 96.5Sn3.5Ag, 99.3Sn0.7Cu, 95.5Sn3.8Ag0.7Cu, or 96.5Sn3.0Ag0.5Cu.

13. A solder paste, comprising:
    44 wt % to 83 wt % of a first solder alloy powder selected from the group consisting of:
        10 wt % to 52 wt % In, 0.1 wt % to less than 3.0 wt % Ag, optionally, 0.001 wt % to 3 wt % of Sb, Bi, Ni, Co, Mn, P, or Zn, and a remainder of Sn;
        10 wt % to 52 wt % In, 0.1 wt % to 1.2 wt % Cu, optionally, 0.001 wt % to 3 wt % of Sb, Bi, Ni, Co, Mn, P, or Zn, and a remainder of Sn;

10 wt % to 52 wt % In, 0.01 wt % to 3.8 wt % Ag, 0.1 wt % to 1.2 wt % Cu, optionally, 0.001 wt % to 3 wt % of Sb, Bi, Ni, Co, Mn, P, or Zn, and a remainder of Sn;

52In48Sn;

40 wt % to 65 wt % Bi, 0.1 wt % to 1.2 wt % Cu, optionally, 0.001 wt % to 3 wt % of Sb, In, Ni, Co, Mn, P, or Zn, and a remainder of Sn; and 40 wt % to 65 wt % Bi, 0.1 wt % to 2 wt % Ag, 0.1 wt % to 1.2 wt % Cu, optionally, 0.001 wt % to 3 wt % of Sb, In, Ni, Co, Mn, P, or Zn, and a remainder of Sn;

5 wt % to 44 wt % of a second solder alloy powder selected from the group consisting of Sn—Sb and Sn—Sb—Y (Y=Ag, Cu, Bi, In, Ni, Co, Mn, P or Zn), wherein the first solder alloy powder has a liquidus temperature lower than a solidus temperature of the second solder alloy powder; and flux.

14. The solder paste of claim 13, wherein:

the second solder alloy powder consists of 0.5 wt % to 10 wt % Sb, and a remainder of Sn; or the second solder alloy powder is Sn—Sb—Y (Y=Ag, Cu, Bi, In, Ni, Co, Mn, P or Zn) consisting of 0.5 wt % to 10 wt % Sb, 0.001 wt % to 5 wt % of Y, and a remainder of Sn.

15. A method, comprising:

placing a solder paste between components to form an assembly, the solder paste comprising:

44 wt % to 83 wt % of a first solder alloy powder selected from the group consisting of:

10 wt % to 52 wt % In, 0.1 wt % to 1.2 wt % Cu, optionally, 0.001 wt % to 3 wt % of Sb, Bi, Ni, Co, Mn, P, or Zn, and a remainder of Sn;

10 wt % to 52 wt % In, 0.01 wt % to 3.8 wt % Ag, 0.1 wt % to 1.2 wt % Cu, optionally, 0.001 wt % to 3 wt % of Sb, Bi, Ni, Co, Mn, P, or Zn, and a remainder of Sn;

52In48Sn;

40 wt % to 65 wt % Bi, 0.1 wt % to 1.2 wt % Cu, optionally, 0.001 wt % to 3 wt % of Sb, In, Ni, Co, Mn, P, or Zn, and a remainder of Sn; and 40 wt % to 65 wt % Bi, 0.1 wt % to 2 wt % Ag, 0.1 wt % to 1.2 wt % Cu, optionally, 0.001 wt % to 3 wt % of Sb, In, Ni, Co, Mn, P, or Zn, and a remainder of Sn;

5 wt % to 44 wt % of a second solder alloy powder selected from the group consisting of: Sn—Ag, Sn—Cu, Sn—Ag—Cu, Sn—Sb, an Sn—Ag alloy, an Sn—Cu alloy, an Sn—Ag—Cu alloy, and an Sn—Sb alloy; and flux; and reflow soldering the assembly at a peak reflow soldering temperature below a solidus temperature of the second solder alloy powder and above a liquidus temperature of the first solder alloy powder to form a solder joint.

16. The method of claim 15, wherein:

during reflow soldering, the second solder alloy powder partially dissolves into a molten form of the first solder alloy powder, and the solder joint has a liquidus temperature higher than the peak reflow soldering temperature.

17. The method of claim 16, wherein during reflow soldering, the second solder alloy powder does not form an intermetallic compound with the molten form of the first solder alloy powder.

18. The method of claim 15, wherein: the solder joint has a solidus temperature higher than a solidus temperature of the first solder alloy powder.

19. A solder joint formed by a process, the process comprising:

placing a solder paste between components to form an assembly, the solder paste comprising:

44 wt % to 83 wt % of a first solder alloy powder selected from the group consisting of:

10 wt % to 52 wt % In, 0.1 wt % to 1.2 wt % Cu, optionally, 0.001 wt % to 3 wt % of Sb, Bi, Ni, Co, Mn, P, or Zn, and a remainder of Sn;

10 wt % to 52 wt % In, 0.01 wt % to 3.8 wt % Ag, 0.1 wt % to 1.2 wt % Cu, optionally, 0.001 wt % to 3 wt % of Sb, Bi, Ni, Co, Mn, P, or Zn, and a remainder of Sn;

52In48Sn;

40 wt % to 65 wt % Bi, 0.1 wt % to 1.2 wt % Cu, optionally, 0.001 wt % to 3 wt % of Sb, In, Ni, Co, Mn, P, or Zn, and a remainder of Sn; and 40 wt % to 65 wt % Bi, 0.1 wt % to 2 wt % Ag, 0.1 wt % to 1.2 wt % Cu, optionally, 0.001 wt % to 3 wt % of Sb, In, Ni, Co, Mn, P, or Zn, and a remainder of Sn;

5 wt % to 44 wt % of a second solder alloy powder selected from the group consisting of: Sn—Ag, Sn—Cu, Sn—Ag—Cu, Sn—Sb, an Sn—Ag alloy, an Sn—Cu alloy, an Sn—Ag—Cu alloy, and an Sn—Sb alloy; and flux; and reflow soldering the assembly at a peak reflow soldering temperature below a solidus temperature of the second solder alloy powder and above a liquidus temperature of the first solder alloy to form the solder joint.

20. The solder joint of claim 19, wherein:

during reflow soldering, the second solder alloy powder partially dissolves into a molten form of the first solder alloy powder, and the solder joint has a liquidus temperature higher than the peak reflow soldering temperature.

21. A solder joint formed by a process, the process comprising:

placing a solder paste between components to form an assembly, the solder paste comprising:

44 wt % to 83 wt % of a first solder alloy powder selected from the group consisting of:

10 wt % to 52 wt % In, 0.1 wt % to less than 3.0 wt % Ag, optionally, 0.001 wt % to 3 wt % of Sb, Bi, Ni, Co, Mn, P, or Zn, and a remainder of Sn;

10 wt % to 52 wt % In, 0.1 wt % to 1.2 wt % Cu, optionally, 0.001 wt % to 3 wt % of Sb, Bi, Ni, Co, Mn, P, or Zn, and a remainder of Sn;

10 wt % to 52 wt % In, 0.01 wt % to 3.8 wt % Ag, 0.1 wt % to 1.2 wt % Cu, optionally, 0.001 wt % to 3 wt % of Sb, Bi, Ni, Co, Mn, P, or Zn, and a remainder of Sn;

52In48Sn;

40 wt % to 65 wt % Bi, 0.1 wt % to 1.2 wt % Cu, optionally, 0.001 wt % to 3 wt % of Sb, In, Ni, Co, Mn, P, or Zn, and a remainder of Sn; and 40 wt % to 65 wt % Bi, 0.1 wt % to 2 wt % Ag, 0.1 wt % to 1.2 wt % Cu, optionally, 0.001 wt % to 3 wt % of Sb, In, Ni, Co, Mn, P, or Zn, and a remainder of Sn;

5 wt % to 44 wt % of a second solder alloy powder selected from the group consisting of Sn—Sb and Sn—Sb—Y (Y=Ag, Cu, Bi, In, Ni, Co, Mn, P or Zn); and flux; and reflow soldering the assembly at a peak reflow soldering temperature below a solidus temperature of the second solder alloy powder and above a liquidus temperature of the first solder alloy to form the solder joint.

\* \* \* \* \*